United States Patent
Kim

[11] Patent Number: 6,012,751
[45] Date of Patent: Jan. 11, 2000

[54] DEVICE FOR INTRODUCING A VACUUM TO THE VACUUM CHUCK OF A SEMICONDUCTOR DEVICE FABRICATION FACILITY

[75] Inventor: Jin-man Kim, Seoul, Rep. of Korea

[73] Assignee: Samsung Electronics Co., Ltd., Suwon, Rep. of Korea

[21] Appl. No.: 09/144,436

[22] Filed: Sep. 1, 1998

[30] Foreign Application Priority Data

Nov. 18, 1997 [KR] Rep. of Korea ............. 97-60897

[51] Int. Cl.[7] .................................................. B25J 15/06
[52] U.S. Cl. ................... 294/64.1; 414/752; 414/941; 901/19
[58] Field of Search .................. 294/64.1, 64.2, 294/1.1; 414/749, 752, 935, 941; 901/19, 40

[56] References Cited

U.S. PATENT DOCUMENTS

| | | | |
|---|---|---|---|
| 3,112,134 | 11/1963 | Ponsen | 294/64.1 |
| 4,767,142 | 8/1988 | Takahashi et al. | 294/64.1 |
| 4,776,745 | 10/1988 | Foley | 414/749 |
| 4,813,732 | 3/1989 | Klem | 414/941 |
| 4,961,682 | 10/1990 | Nilsson | 294/64.1 |
| 5,052,884 | 10/1991 | Igari | 901/19 |
| 5,263,384 | 11/1993 | Suzuki | 414/749 |

FOREIGN PATENT DOCUMENTS 402288247  11/1990  Japan ...................... 414/941

*Primary Examiner*—Dean J. Kramer
*Assistant Examiner*—Paul Chin
*Attorney, Agent, or Firm*—Jones Volentine, LLP

[57] ABSTRACT

A vacuum transfer device for engaging a vacuum chuck to introduce a vacuum thereto includes an upper fixed plate fixed, a lower plate slidingly coupled with the upper plate so as to be capable of sliding toward and away from the vacuum chuck, and a pushing unit mounted to the upper plate for forcing the lower plate into position against the vacuum chuck. The pushing unit has a lever urged by a coil spring to press a roller into engagement with a curved surface of the lower plate, and gap control elements by which the position of the roller relative to the inclined surface can be adjusted to in turn adjust the force exerted by the roller on the lower plate. The gap control elements along with the curved surface of the lower plate make it quite easy to set the precise force by which the roller positions the lower plate of the device against the vacuum chuck. This in turn prevents the chuck and vacuum transfer device from being damaged, minimizes the time the facility must be down while the pushing unit is being adjusted, and works to ensure that no gap will be left between the vacuum transfer device and the vacuum chuck.

13 Claims, 6 Drawing Sheets

6,012,751

DEVICE FOR INTRODUCING A VACUUM TO THE VACUUM CHUCK OF A SEMICONDUCTOR DEVICE FABRICATION FACILITY

BACKGROUND OF THE INVENTION

1. Field of the Invention

The present invention relates to a vacuum transfer system of a semiconductor device fabrication facility. More particularly, the present invention relates to a device of the system through which a vacuum is introduced to a vacuum chuck for evacuating the chuck to cause a wafer to adhere thereto.

2. Description of the Related Art

Generally, the fabrication of semiconductor devices is a sensitive process requiring strictly controlled processing conditions, and precise manufacturing techniques. The semiconductor device fabrication facility includes a vacuum transfer system through which the force of a vacuum, created by a vacuum pump, is transferred to a vacuum chuck to secure by suction a wafer to the chuck.

A conventional vacuum transfer system will now be described referring to FIGS. 1 and 2. The conventional vacuum transfer system 10 comprises a lower plate 20 having a vacuum port 16, a thermocouple 18 protruding from the front of the lower plate 20 adjacent the vacuum port 16, an upper plate 12 fixed in place in the device, and a pushing unit 24 fixed to the upper plate 12 for moving the lower plate 20 toward a vacuum chuck 22.

The lower plate 20 is coupled to the upper plate 12 by a guide 14 fixed to the lower plate 20. A guide rail (not shown) is provided on the bottom of the upper plate 12. The guide rail is connected to the guide 14, and the lower plate 20 is moved back and forth along the guide rail.

The vacuum port 16 faces the vacuum chuck 22. The thermocouple 18 terminates adjacent the end of the vacuum port 16 in order to detect the temperature at the location at which a wafer is mounted to the vacuum chuck 22.

In addition, the lower plate 20 has a recess 28 in one side thereof. The recess is defined by an inclined surface 26 which extends at an angle relative to the longitudinal direction of the guide rail. The width of the lower plate 20 is thus reduced at the recess 28.

The pushing unit 24 includes a plate spring 30 which is folded over on itself. When the ends of the plate spring 30 are moved away from each other, the elasticity of the plate spring 30 gives rise to a restoring force which urges both ends back toward each other. There is a rectangular locking slot 32 in one end of the plate spring 30. The plate spring 30 is fixed on the side of the upper plate 12 by two locking bolts 34 which pass through the locking slot 32. The position of the plate spring 30 can be adjusted by loosening the locking bolts 34, moving the plate spring 30 to a desired position as allowed for by the locking slot 34, and then tightening the locking bolts 34. In addition, the pushing unit 24 includes a vertically extending roller pin 36 fixed to the other end of the plate spring 30, and a roller 38 rotatably supported by the roller pin 36 and urged by the plate spring 30 against the inclined surface 26.

The lower plate 20 is driven to the vacuum chuck 22 by the pushing unit 24 to move the end of the vacuum port 16 into contact with the vacuum chuck 22 whereupon air in the chuck 22 is evacuated through the vacuum port 16.

More specifically, an operator moves the lower plate 20 toward the vacuum chuck 22 until the roller 38 comes into contact with the inclined surface 26. Then, as the roller 38 applies pressure to the inclined surface 26 under the restoring force exerted by the plate spring 30, the lower plate 20 is slid toward the vacuum chuck 22 as guided by the guide rail. The roller 38 continues to move along the inclined surface 26 until the end of the vacuum port 16 contacts the vacuum chuck 22 and the roller 38 comes to rest at a certain location on surface 26.

Typically, the elasticity of the plate spring 30 causes an excessive force to be applied between the contact of the end of the vacuum port 16 and the vacuum chuck 22. Thus, these members can be damaged due to the excessive shock. In an attempt to mitigate this problem, the locking bolts 34 are loosened, and the plate spring 30 is repositioned toward the rear of the upper plate 12 so that less force is exerted on the lower plate 20 when the vacuum port 16 meets the vacuum chuck 22.

On the other hand, the plate spring 30 becomes less resilient over time due to its continuously being deformed while in use, and due to its handling while it is being mounted to and disassembled from the upper plate 12. In this case, the locking bolts 34 are loosened, and the plate spring 30 is repositioned toward the front of the upper plate 12 so that more force will be exerted on the lower plate 20 by the plate spring 30 when the vacuum port 16 meets the vacuum chuck 22.

However, as the plate spring 30 continues to lose its elasticity, eventually a gap will be formed between the vacuum chuck 22 and the vacuum port 16. In this case, a vacuum will not be produced in the vacuum chuck 22 via the vacuum port 16, and the plate spring 30 thus cannot be used any more. Accordingly, the plate spring 30 must be replaced with another plate spring having the same size and elasticity. Such replacement costs add to the cost of manufacturing the semiconductor devices.

In addition, when replacing the plate spring, it is difficult to locate the spring at the precise position which will cause the vacuum port 16 to meet the vacuum chuck 22 without a gap being left therebetween or without excessive shock being generated therebetween. Furthermore, the time and effort it takes to replace the plate spring and correctly position the new plate spring compromises the operation efficiency of the facility.

SUMMARY OF THE INVENTION

An object of the present invention is to provide a vacuum transfer system for inducing a vacuum in a vacuum chuck, which substantially overcomes one or more of the problems, disadvantages and limitations of the related art.

More specifically, an object of the present invention is to provide a vacuum transfer device of the system which is durable, and which can be easily positioned accurately and with non-excessive force against a vacuum chuck of the system.

To achieve these and other objects and advantages, the present invention provides a vacuum transfer device in which the pushing unit fixed to the upper plate has a lever urged by a coil spring to press a roller into engagement with a curved surface of the lower plate, and gap control elements by which the position of the roller relative to the inclined surface can be adjusted to in turn adjust the force exerted by the roller on the lower plate.

The lever is pivotally supported at a central portion thereof. The coil spring is interposed between one end of the lever and a support of the pushing unit. The roller is supported by the other end of the lever so as to be rotatable about a vertical axis.

The lower plate has a laterally extending protrusion at one side thereof. The curved surface engaged by the roller is a concave surface extending rearwardly from the top of the protrusion.

The pushing unit also includes a fixing support fixed to the upper plate, and a moving support disposed side-by-side with the fixing support. The lever is supported by said moving support, and one end of the coil spring rests against the moving support. The fixing and moving supports have a joint by which the moving support can be slid along the fixing support in the direction of movement of the lower plate.

The gap control elements include female screw threads formed at a surface of the moving support facing the fixing support, a semi-annular fixing groove formed in a surface of the fixing support facing the moving support, a semi-cylindrical slide recess formed in the fixing support across from the female screw threads, a semi-cylindrical inserting groove formed in the moving support across from the fixing groove, and a gap control screw having a male threaded portion mating with the female threads, and an annular projection received in a cavity formed by the fixing groove and inserting groove.

Preferably, means are provided for disengaging the roller from the curved surface of the lower plate so that a vacuum port of the vacuum transfer device can be easily moved out of engagement with the vacuum chuck. Such means may include a fixing bar extending from the moving support, a disk rotatably supported on the end of the fixing bar, and a link pivotally coupled to the lever and to the disk.

A coil spring is less subject to fatigue than the plate spring of the prior art. Therefore, the pushing unit of the present invention does not have to be adjusted and repaired as frequently as the pushing unit of the prior art.

Moreover, the gap control elements along with the curved surface of the lower plate make it quite easy to set the precise force by which the roller positions the vacuum port of the device against the vacuum chuck. This in turn prevents the chuck and vacuum transfer device from being damaged, minimizes the time the facility must be down while the pushing unit is being adjusted, and works to ensure that no gap will be left between the vacuum transfer device and the vacuum chuck.

BRIEF DESCRIPTION OF THE DRAWINGS

These and other objects, features and advantages of the present invention will become clearer from the following detailed description of a preferred embodiment thereof, made with reference to the accompanying drawings, of which.

DETAILED DESCRIPTION OF THE PREFERRED EMBODIMENT

Figure 1:
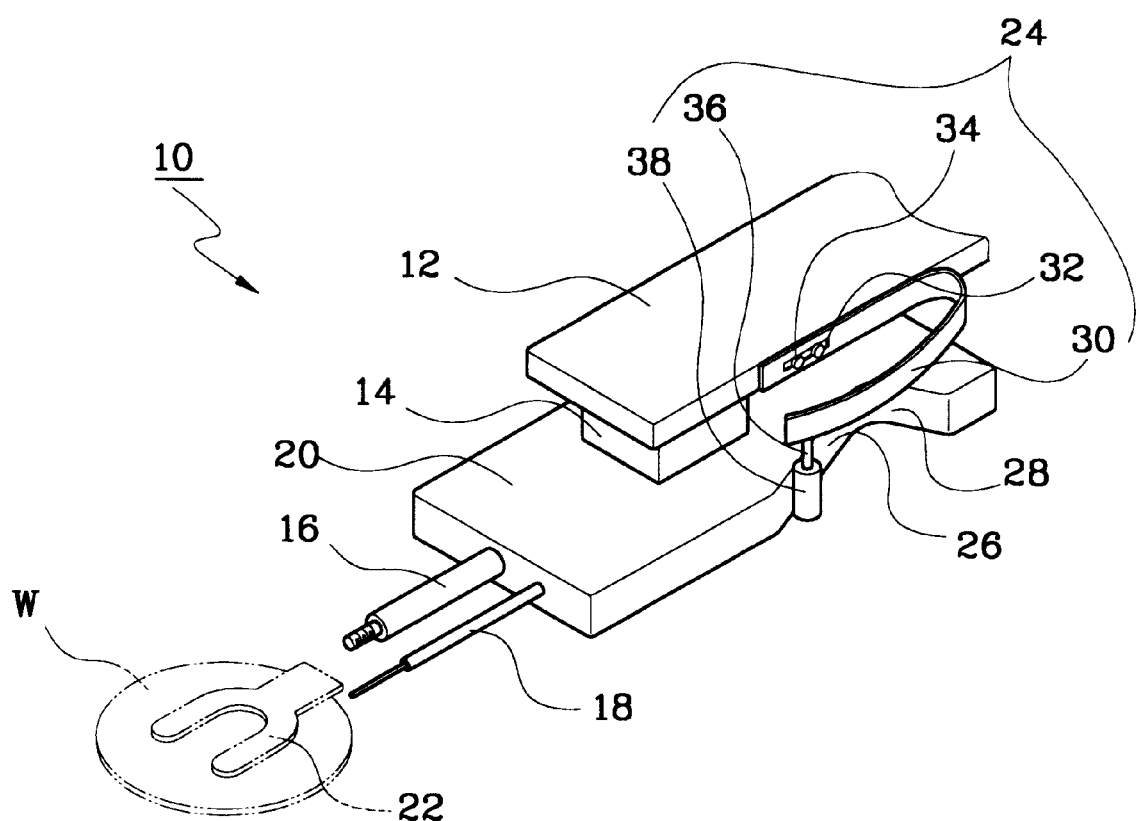
FIG. 1 is a perspective view of a conventional vacuum transfer device.
Figure 2:
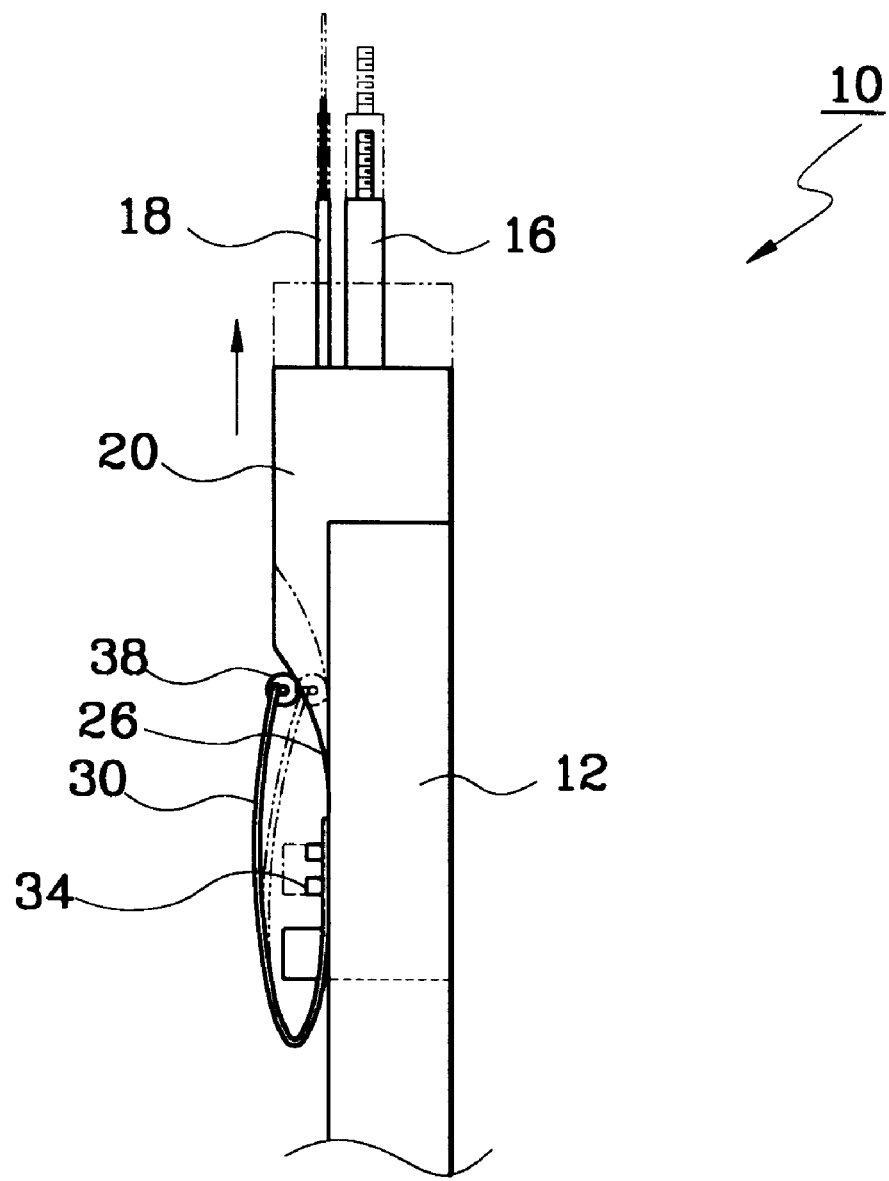
FIG. 2 is a top view of the conventional vacuum transfer device.

A preferred embodiment of the present invention will now be described with reference to FIG. 3 to FIG. 7. Throughout these figures, like numbers refer to like elements.

The vacuum transfer device 40 of the present invention comprises an upper plate 12 fixed in place in the vacuum transfer system, a lower plate 42 capable of sliding relative to the upper plate 12 and coupled thereto by a guide 14, and a pushing unit 44 fixed to the upper plate 12 and engaged with the lower plate 42. The pushing unit 44 has a gap control part 46 whose function will be described later on.

A guide rail 48 is fixed to the bottom of the upper plate 12. The guide 14 is fixed to the top of the lower plate 42 and is slidingly engaged with the guide rail 48, so that the lower plate 42 can slide back and forth relative to the upper plate 12.

A vacuum port 16 and a thermocouple 18 protrude from the front of the lower plate 42 toward a vacuum chuck (not shown). The lower plate 42 also has a protrusion 50 at one side thereof, a side recess defined by a side wall 52 in the same side of the lower plate as the protrusion 50, and an inclined surface 56 which extends rearwardly from the top of the protrusion 50 to the wall 52. The inclined surface 56 is gently curved with respect to the direction of movement of the lower plate 42. More specifically, by being curved, the inclined surface has a slope which is inclined and varies relative to the direction of movement of the lower plate 42, as viewed in a horizontal plane. A handle 58 extends outwardly from the aforementioned side of the lower plate 42 for allowing the lower plate 42 to be easily slid back and forth by an operator.

The pushing unit 44 includes a pair of supports provided on one side of the upper plate 12. These supports comprise a fixed support 60 fixed to the upper plate 12, and a moving support 62 capable of sliding back and forth with respect to the fixed support 60. The supports have a joint 64 which connects the supports together and yet allows the moving support 62 to move linearly relative to the fixed support 60.

Figure 5:
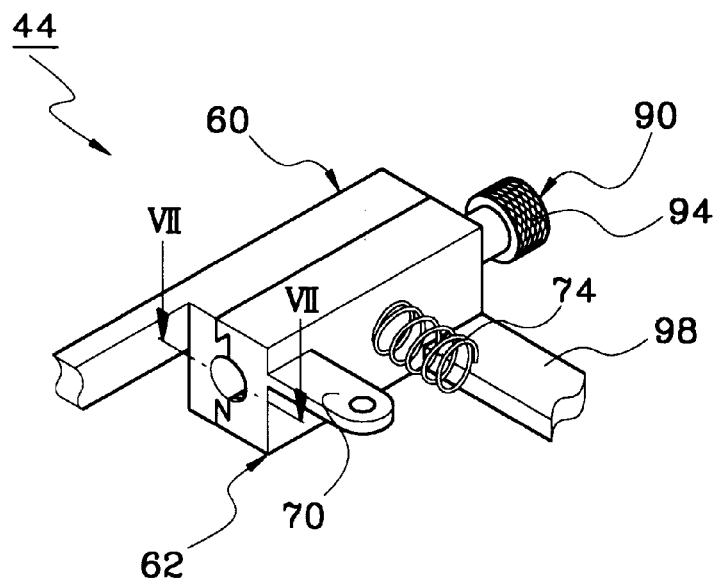
FIG. 5 is a perspective view of a pushing unit of the vacuum transfer device.
Figure 6:
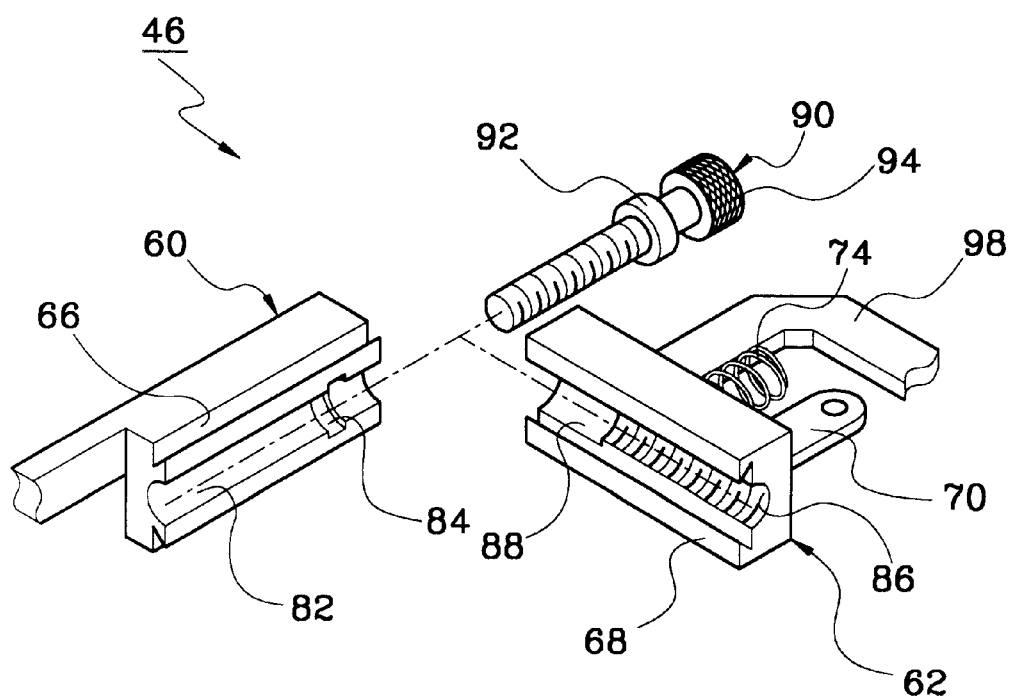
FIG. 6 is an exploded view of a gap controlling part of the pushing unit.
Figure 7:
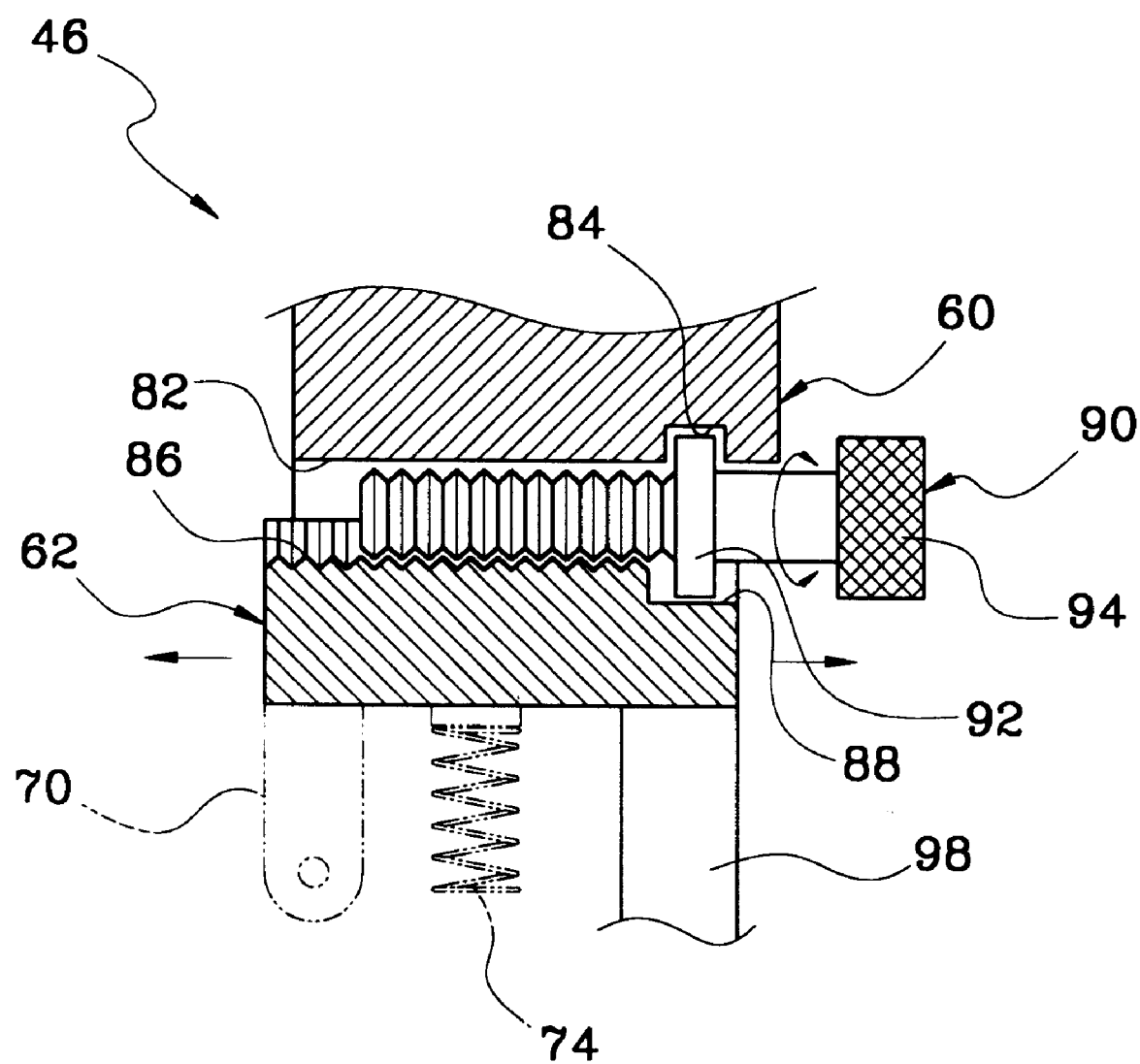
FIG. 7 is a cross-sectional view of the gap controlling part, taken along line VII—VII of FIG. 5.

The joint 64 comprises a guide recess 66 extending parallel to the guide rail 48 in a side surface of the fixed support 60, and a complementary guide projection 68 extending from an opposing side surface of the moving support 62. The guide projection 68 is fitted in the guide recess 66, as best shown in FIGS. 5 and 6 to mate the supports 60, 62 together. In this example, the joint 64 is a dovetail. However, other suitable joints, i.e., shapes of the projection 68 and recess 66, can be used.

Figure 3:
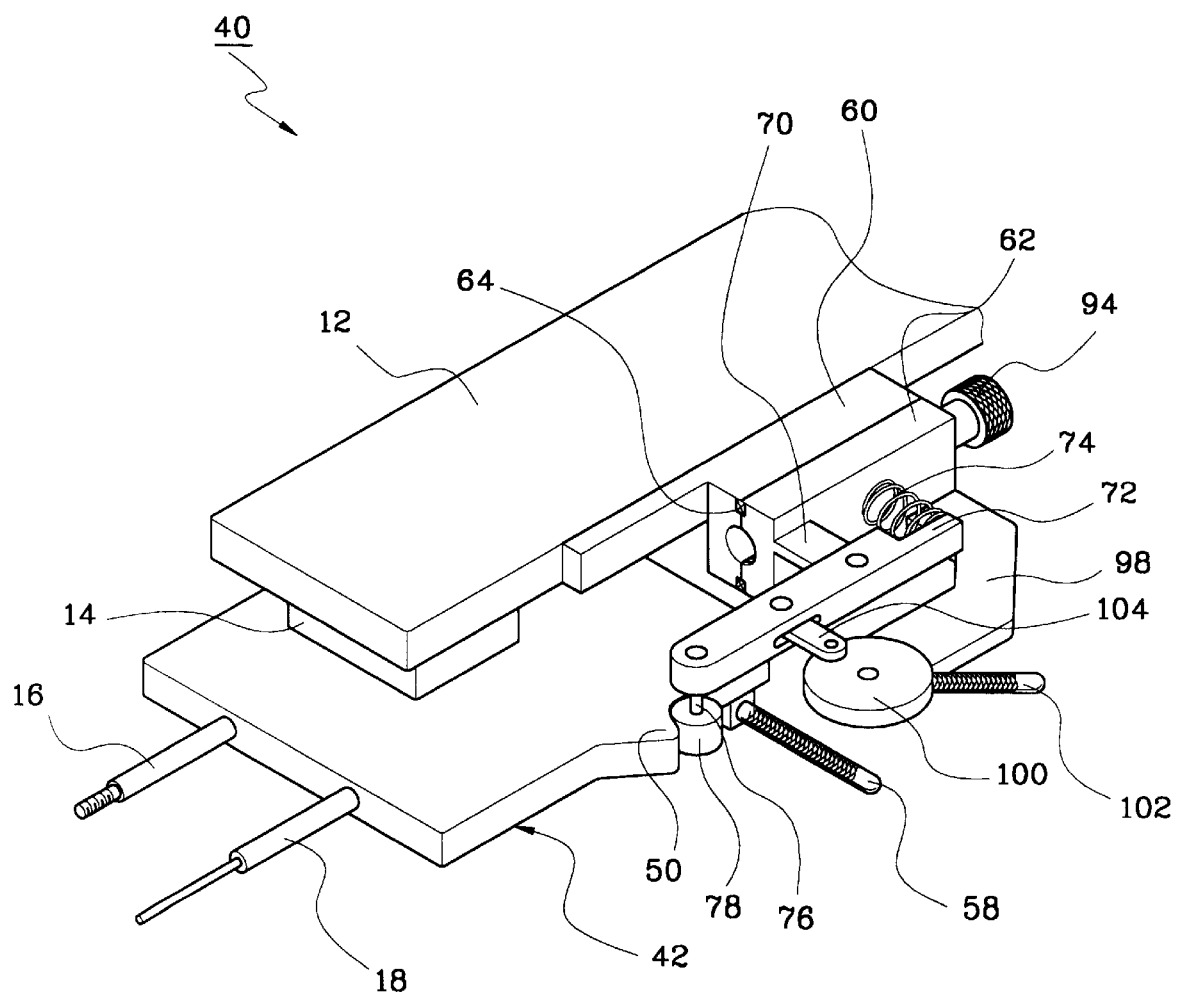
FIG. 3 is a perspective view of the vacuum transfer device according to the present invention.
Figure 4:
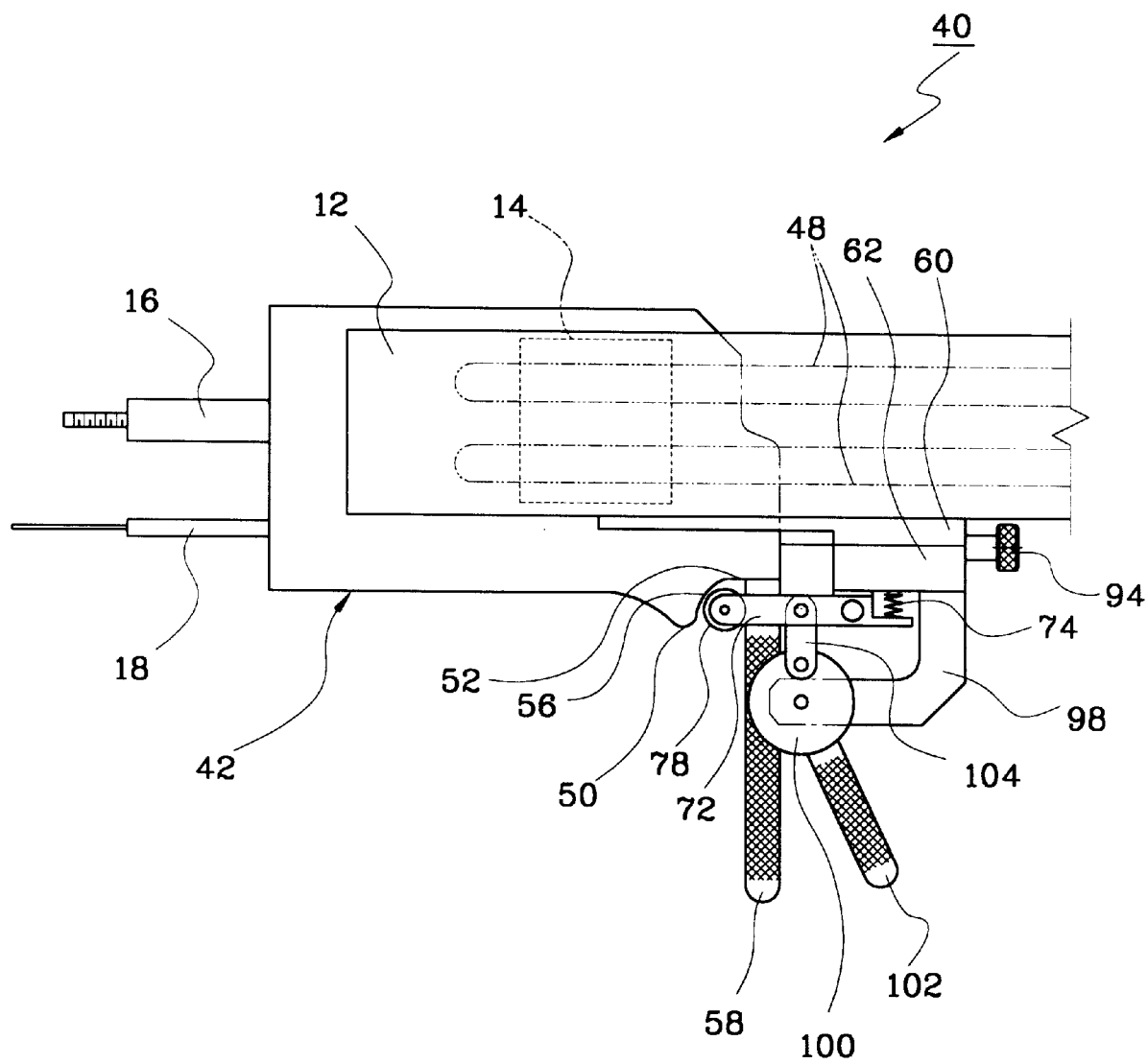
FIG. 4 is a top view of the vacuum transfer device according to the present invention.

In addition, a fixer 70 projects from a side wall of the moving support 62, as best shown in FIG. 3. A lever 72 is pivotally mounted on the end of the fixer 70. A resilient member 74 is interposed between one end of the lever 72, spaced a short distance from the fixer 70, and the moving support 62. As shown in the figure, the resilient member 74 is a coil spring.

A pin 76 extends vertically from the other end of the lever 72. A cam, in the form of a roller 78, is rotatably supported by the pin 76. The roller 78 is urged by the resilient member 74 into contact with the side of the lower plate 42. There, the roller 78 rests on the inclined surface 56 located between the top of the protrusion 50 and the side wall 52 of the lower plate 42.

The gap control part 46 of the pushing unit 44 is for preventing a gap from being left between the vacuum port 16 and the vacuum chuck when the lower plate 42 is pushed to the vacuum chuck for the purpose of inducing a vacuum therein. The gap control part performs this function by sliding the moving support 62 relative to the fixed support 60 and hence, the location of the roller 78 relative to the inclined surface 56.

As shown in FIG. 6, the gap control part 46 is constituted by a slide recess 82 formed in the surface of the fixing support 60 facing the moving support 62, a semi-annular fixing groove 84 formed in the same surface and having a larger diameter than that of the slide recess 82 so as to intersect the same, a set of female threads 86 formed at an inner surface of the moving support 62 facing the fixed support 60, an insertion groove 88 formed in the inner surface of the moving support 62, and a gap control screw 90.

The slide recess is semi-cylindrical and extends longitudinally in the direction of movement of the moving support 62. The female threads 86 of the moving support 62 are centered coaxially with the guide projection 68 and inscribe the portion of a cylinder completed by the slide recess 82. The inserting groove 88 extends to one side of the female threads 86 from a location directly opposite the fixing groove 84.

The slide recess 82, the fixing groove 84, the female threads 86, and the inserting groove 88 together form a cylindrical cavity within the fixing support 60 and the moving support 62. The gap control screw 90 is received in this cavity. The gap control screw 90 has male threads at one end thereof and which male threads mate with the female threads 86, an annular projection 92 received in the fixing groove 84 and insertion groove 88, and a control knob 94 at the other end thereof. The control knob 94 is knurled so as to be easily gripped by an operator.

Returning now to FIGS. 3 and 4, the pushing unit 44 also has a disengaging part for allowing the lower plate 42 to be moved rearwardly.

The disengaging part comprises: an L-shaped fixing bar 98 extending from the side wall of the moving support 62, a disk 100 rotatably supported on the end of the fixing bar 98, and a link 104 having one end pivotally coupled to the disk 100 at a location spaced from its center. The other end of the link 104 is pivotally coupled to the lever 72 at a location between the pivot point of the lever 72 and the end at which the roller 78 is supported. Furthermore, a disk handle 102 extends from the periphery of the disk 100. Accordingly, when the disk 100 is rotated by the handle 102, the lever 72 connected to the disk 100 by the link 104 is pivoted relative to the fixer 70. As a result, the roller pin 76 is moved outwardly of the top of the protrusion 50. In this state, the lower plate 42 can be moved rearwardly.

Now, the operation of the vacuum transfer device 40 will be described.

First, the disk 100 is rotated by using the disk handle 102 to move the roller 78 to a position which is spaced laterally outward of the protrusion 50. At about the same time, the lower plate 42 is moved toward the vacuum chuck, by pushing the handle 58, until the roller 78 is located next to the inclined surface 56 just behind the top of the protrusion 50. Then, the disk handle 102 is slowly released, whereby the lever 72 is pivoted by the resilient member 74. The roller 78 supported by the roller pin 76 so as to be rotatable about the axis thereof is thus urged into rolling contact with the inclined surface 56.

The lower plate 42 is slid toward the vacuum chuck by the engagement of the roller 78 with the inclined surface 56. As the roller 78 moves along the inclined surface 56, the end of the vacuum port 16 is moved into contact with the vacuum chuck so as to induce a vacuum therein. If the force by which the roller 78 is pressed against the inclined surface 56 is excessive, the operator rotates the control knob 94 of the gap control unit 46 to move the moving support 62 backward, in which case the roller 78 rests on a more gently inclined part of the inclined surface 56. Hence, the roller 78 generates less force on the lower plate 42 acting in a direction which urges the lower plate 42 forward.

If the member 74 loses some of its resiliency over time, the roller 78 can, in its normal position, be set by the gap control part 44 against a more steeply inclined part of the inclined surface 56. Even though the resilient member 74 is not as resilient as it used to be, it can still create the same amount of force through the roller 78 on the lower plate 42. First, it is to be noted that the inclined surface is curved, forms a concavity rearwardly of the top of the protrusion 50, and has a bigger radius of curvature than the radius of said roller 78. Setting the roller 78 at a steeper part of the inclined surface 56 (where a tangent to the surface subtends a greater angle with the moving direction of the lower plate 42) produces a force on the lower plate 42 which may have less magnitude than the force produced when the resilient member 74 was more resilient, but which force has a greater component acting in the direction of movement of the lower plate 42.

The resilient member 74, a coil spring, has to be replaced once the resilient member 74 loses most of its elasticity.

When it is necessary to separate the vacuum port 16 from the vacuum chuck, such as during the cleaning of the facility or the replacement of the vacuum chuck, an operator rotates the disk 100 using disk handle 102, whereupon, as described above, the roller 78 is moved laterally outwardly of the protrusion 50. Then, the operator pulls the handle 58 to move the lower plate 42 backward so that the vacuum port 16 is separated from the vacuum chuck.

Although the present invention has been described in detail, it should be understood that various changes, substitutions and alterations can be made thereto without departing from the spirit and scope of the invention as defined by the appended claims.

What is claimed is:

1. A vacuum transfer device of a vacuum transfer system for use in a semiconductor device fabrication facility, said device comprising:

a fixed upper plate;

a lower plate slidingly coupled to said upper plate so as to be slidable relative to said upper plate in a direction back and forth, said lower plate having an inclined surface integral therewith, the inclined surface having a slope which is inclined and varies relative to said direction;

a guide by which said lower plate is slidingly coupled to the upper plate;

a pushing unit mounted to said upper plate, said pushing unit including a moving support mounted so as to be movable in said direction relative to said fixed upper plate, a lever having first and second ends, the lever being carried by said moving support so as to move therewith, a resilient member connected to one of said ends of the lever and exerting a force on the lever which moves the lever in a direction urging the other end of the lever toward said lower plate, and a cam connected to said other end of the lever and engageable with said inclined surface of the lower plate under the force exerted by said resilient member on the lever.

2. The vacuum transfer device of claim 1, wherein said pushing unit further includes a fixer protruding laterally from said moving support and to which fixer said lever is pivotally mounted, and a pin extending vertically from said other end of the lever, said resilient member being interposed between said moving support and said one end of the lever, and said cam comprising a roller mounted to said pin so as to be rotatable about a vertically extending longitudinal axis thereof.

3. The vacuum transfer device of claim 2, wherein said resilient member is a coil-spring.

4. The vacuum transfer device of claim 2, wherein said lower plate has a laterally extending protrusion, said inclined surface extending rearwardly from the top of the protrusion.

5. The vacuum transfer device of claim 4, wherein said inclined surface is curved, forms a concavity rearwardly of the top of said protrusion, and has a bigger radius of curvature than the radius of said roller.

6. The vacuum transfer device of claim 1, wherein said lower plate has a laterally extending protrusion, said inclined surface extending rearwardly from the top of the protrusion.

7. The vacuum transfer system of claim 1, wherein said pushing unit further includes a fixing support integral with said upper plate, and said fixing support and said moving support comprise a joint by which the moving support is both mated to said fixing support and is slidable in said direction relative to the fixing support.

8. The vacuum transfer device of claim 7, wherein said fixing support has a surface facing said moving support and a guide recess extending in said surface, and said moving support has a surface facing said fixing support and a guide projection extending therefrom, said guide projection being received in said guide recess to form said joint mating said moving support to said fixing support.

9. The vacuum transfer system of claim 8, wherein said fixing support has a slide recess in the surface thereof facing said moving support, and a semi-annular fixing groove open to said slide recess, said moving support has female screw threads and an inserting groove in the surface thereof facing the fixing support, said female screw threads being disposed across from said slide recess, and said inserting groove being disposed to one side of the female screw threads and across from said inserting groove, and said pushing unit further includes a gap control screw having at one end thereof a male threaded portion which mates with the female screw threads, and an annular projection received in said semi-annular fixing groove and said inserting groove such that said gap control screw is restrained from moving axially but is rotatable relative to said fixing support.

10. The vacuum transfer device of claim 1, and further comprising disengaging means for disengaging said cam from said inclined surface.

11. The vacuum transfer device of claim 10, wherein said disengaging means comprises a fixing bar extending from said moving support, a disk rotatably supported by said fixing bar, and a link pivotally connected to said lever and to said disk at a location spaced from the center of said disk.

12. The vacuum transfer device of claim 11, and further comprising a disk handle extending from a peripheral portion of the disk and by which handle the disk can be rotated about the center thereof.

13. The vacuum transfer device of claim 1, and further comprising a handle protruding laterally from said lower plate and by which handle said lower plate can be slid in said direction.

* * * * *